(12) United States Patent
Tanaka

(10) Patent No.: US 9,043,176 B2
(45) Date of Patent: May 26, 2015

(54) BATTERY DEGRADATION DETERMINATION DEVICE, BATTERY DEGRADATION DETERMINATION METHOD AND BATTERY DEGRADATION DETERMINATION SYSTEM

(75) Inventor: Ryuuta Tanaka, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 511 days.

(21) Appl. No.: 13/556,740

(22) Filed: Jul. 24, 2012

(65) Prior Publication Data

US 2013/0030736 A1    Jan. 31, 2013

(30) Foreign Application Priority Data

Jul. 25, 2011    (JP) .................................. 2011-161762

(51) Int. Cl.
  *G06F 19/00*    (2011.01)
  *G01R 31/36*    (2006.01)
(52) U.S. Cl.
  CPC ........ *G01R 31/3679* (2013.01); *G01R 31/3651* (2013.01); *G01R 31/3662* (2013.01)
(58) Field of Classification Search
  CPC .................. G01R 31/3662; G01R 31/3651
  USPC ...................... 702/63, 64, 182–185
  See application file for complete search history.

(56) References Cited

U.S. PATENT DOCUMENTS

| 2002/0120906 | A1 | 8/2002 | Xia et al. |
| 2003/0204328 | A1 | 10/2003 | Tinnemeyer |
| 2004/0006440 | A1* | 1/2004 | Kim et al. ........................ 702/63 |
| 2009/0096459 | A1* | 4/2009 | Yoneda et al. ................ 324/430 |

FOREIGN PATENT DOCUMENTS

| JP | 2004241325 A | 8/2004 |
| WO | 2005093447 A2 | 10/2005 |

OTHER PUBLICATIONS

Extended Search Report dated Nov. 2, 2012 issued by the European Patent Office in counterpart European Application No. 12177703.1.

* cited by examiner

*Primary Examiner* — Edward Raymond
(74) *Attorney, Agent, or Firm* — Sughrue Mion, PLLC

(57) ABSTRACT

A battery degradation determination device includes a fitting module configured to fit AC impedance measurement data into an equivalent circuit model including at least one circuit block in which a resistance and a constant phase element are connected in parallel, and to obtain circuit constants in the equivalent circuit model, a P-value saving module configured to save P values being index of the constant phase element obtained by fitting AC impedance measurement data of a reference battery to the equivalent circuit model, and a degradation determination module configured to perform degradation determination for a battery as a determination target based on circuit constants obtained by fitting AC impedance measurement data of the battery as a determination target to the equivalent circuit model with the use of the P values as fixed values, with reference to correlations between degrees of battery degradation and the circuit constants in the equivalent circuit model.

6 Claims, 13 Drawing Sheets

ENLARGED VIEW

BATTERY DEGRADATION DETERMINATION DEVICE, BATTERY DEGRADATION DETERMINATION METHOD AND BATTERY DEGRADATION DETERMINATION SYSTEM

CROSS-REFERENCE TO RELATED APPLICATION(S)

The present application claims the benefit of priority of Japanese Patent Application No. 2011-161762, filed on Jul. 25, 2011, the contents of which are incorporated herein by reference.

BACKGROUND

1. Technical Field

The present disclosure relates to a battery degradation determination device, a battery degradation determination method and a battery degradation determination system, which determine a degree of battery degradation based on AC impedance measurement data for a battery.

2. Related Art

A battery such as a secondary battery or a fuel cell is degraded depending upon a number of recharging cycles, a usage environment, a storage condition, and the like and becomes unserviceable when the service life thereof is eventually exceeded. For this reason, various methods for determining a degree of battery degradation have previously been proposed, and for example, a method has been known in which the degree of degradation is determined based on a circuit constant obtained by fitting AC impedance measurement data of the battery to an equivalent circuit model of the battery.

As an equivalent circuit model, an RC two-stage model has widely been used in which two stages of RC parallel circuit blocks are connected to a resistance R1 as shown in FIG. 9. The unknown circuit constants in the RC parallel circuit block are R and C, the number of which is two per one stage, and it is possible to easily perform fitting because the number of unknown circuit constants in the RC two-stage model are not so large.

An AC impedance characteristic is typically represented by a Nyquist diagram as a complex impedance characteristic. As shown in FIG. 10, when the RC two-stage model is used as the equivalent circuit model, fitting error tends to be large for a battery with a deformed arc-shaped complex impedance characteristic. Here, in FIG. 10, a broken line represents an actually measured complex impedance characteristic, while a solid line represents a complex impedance characteristic based on circuit constants obtained by fitting to the RC two-stage model.

An actual battery rarely has a complex impedance characteristic represented by perfect semicircular shapes and has a deformed arc-shaped complex impedance characteristic as shown by the broken line in FIG. 10 in many cases. For this reason, it cannot be said that a degradation determination result based on the circuit constants obtained by fitting to the RC two-stage model is always sufficiently appropriate.

RELATED ART DOCUMENT

Patent Document

[Patent Document 1] Japanese Unexamined Patent Application Publication No. 2004-241325

Generally, fitting error can be reduced with respect to the deformed arc-shaped complex impedance characteristic with the use of an equivalent circuit in which three or more stages of RC parallel circuit blocks are connected. However, the number of unknown circuit constants to be fitted increases.

In addition, it has been known that the use of one or more R and CPE (Constant Phase Element) parallel circuit blocks allows for reducing the fitting error with respect to the deformed arc-shaped AC impedance characteristic. Here, CPE is a non-linear element represented by impedance $Z_{CPE}$ as shown by [Equation 1] where P as a CPE index and T as a CPE constant are used as circuit constants.

$$Z_{CPE}=1/(j\omega)^P T \quad \text{[Equation 1]}$$

The fitting error can be reduced with respect to the deformed arc-shaped complex impedance characteristic as shown in FIG. 12 by using an equivalent circuit model in which there are two stages of R and CPE parallel circuit blocks as shown in FIG. 11, for example. In addition, a broken line represents an actually measured complex impedance characteristic while a solid line represents a complex impedance characteristic based on the circuit constants obtained by fitting to the equivalent circuit model in which two stages of R and CPE parallel circuit blocks are connected in FIG. 12.

However, unknown circuit constants to be fitted in the R and CPE parallel circuit block are R, P, and T, the number of which is three per one stage, and the number of unknown circuit constants to be fitted is increased even in the two-stage model as compared with the RC two-stage model.

If the number of unknown circuit constants to be fitted increases, fitting becomes complicated, and in some cases, it becomes impossible or difficult to determine a degree of battery degradation due to a plurality of obtained solutions. For this reason, a technique has been desired which reduces the fitting error without increasing the number of unknown circuit constants in the equivalent circuit model.

SUMMARY

One or more exemplary embodiments of the present invention provide a battery degradation determination device, a battery degradation determination method, and a battery degradation determination system, which reduces fitting error without increasing a number of unknown circuit constants in an equivalent circuit model to be used for determining a degree of battery degradation.

A battery degradation determination device according to an exemplary embodiment of the invention, comprises:
a fitting module configured to fit AC impedance measurement data into an equivalent circuit model including at least one circuit block in which a resistance and a constant phase element are connected in parallel, and to obtain circuit constants in the equivalent circuit model;
a P-value saving module configured to save P values being index of the constant phase element obtained by fitting AC impedance measurement data of a reference battery to the equivalent circuit model; and
a degradation determination module configured to perform degradation determination for a battery as a determination target based on circuit constants obtained by fitting AC impedance measurement data of the battery as a determination target to the equivalent circuit model with the use of the P values as fixed values, with reference to correlations between degrees of battery degradation and the circuit constants in the equivalent circuit model.

The degradation determination module may be configured to determine that use of the battery as a determination target is not appropriate when fitting error by the obtained circuit constants is equal to or greater than a reference value.

The battery degradation determination device may further comprises:
a fitting initial value setting module configured to set initial values of the circuit constants prior to the fitting by the fitting module,
wherein the fitting initial value setting module is configured to set the initial values with the use of a zero crossing point at which Zim=0 and elliptical approximation using an inflection point and zero of a frequency characteristic diagram of dZim/dZre when AC impedance measurement data is expressed as a Nyquist diagram.

A battery degradation determination method according to an exemplary embodiment of the invention, comprises:
saving P values being index of a constant phase element obtained by fitting AC impedance measurement data of a reference battery to an equivalent circuit model including at least one circuit block in which a resistance and the constant phase element are connected in parallel; and
performing degradation determination for a battery as a determination target based on circuit constants obtained by fitting AC impedance measurement data of the battery as a determination target to the equivalent circuit model with the use of the P values as fixed values, with reference to database storing correlations between degrees of battery degradation and the circuit constants in the equivalent circuit model.

The battery degradation determination method may further comprises:
creating the database by recording correlations between a plurality of known degrees of degradation and circuit constants obtained by fitting AC impedance measurement data of a battery whose degree of degradation is known to the equivalent circuit model with the use of the P values as fixed values.

According to the exemplary embodiments of the present invention, it is possible to provide a battery degradation determination device, a battery degradation determination method, and a battery degradation determination system, which reduces fitting error without increasing a number of unknown circuit constants in an equivalent circuit model to be used for determining a degree of battery degradation.

BRIEF DESCRIPTION OF THE DRAWINGS

The above and other aspects of the present invention will become more apparent from the following description of exemplary embodiments, taken in conjunction with the accompanying drawings of which.

DETAILED DESCRIPTION

Figure 1:
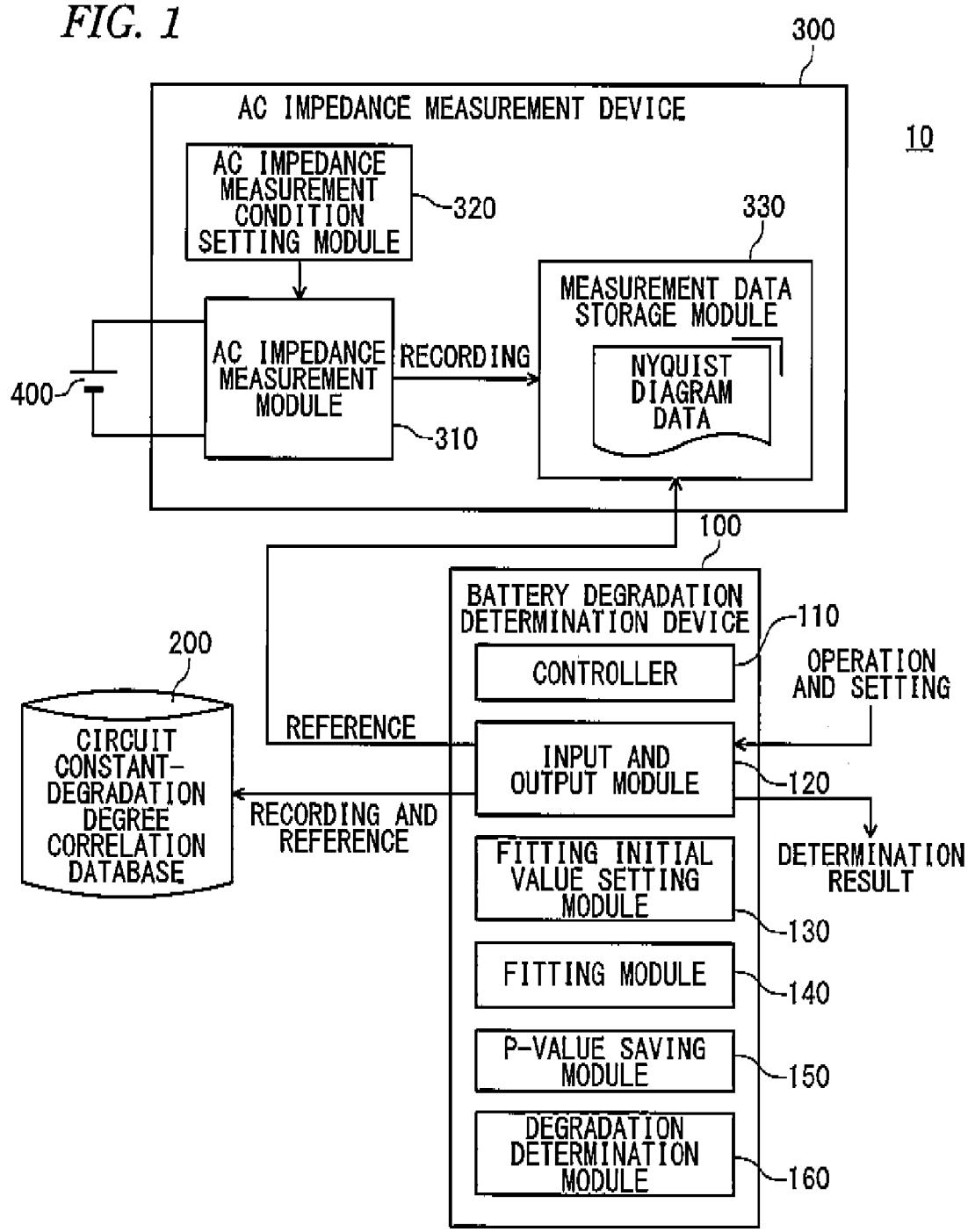
FIG. 1 is a block diagram showing a configuration of a battery degradation determination system according to an embodiment.

Description will be given of an embodiment of the present invention with reference to the drawings. FIG. 1 is a block diagram showing a configuration of a battery degradation determination system according to an embodiment. As shown in the drawing, a battery degradation determination system 10 includes a battery degradation determination device 100, a circuit constant-degradation degree correlation database 200, and an AC impedance measurement device 300. The battery degradation determination system 10 may be configured as a single device including the above components or as a set of respectively independent devices. Although the battery as a target of the degradation determination is preferably a secondary battery such as a lithium ion battery, the present invention can be applied to degradation determination of other batteries such as a fuel cell. Furthermore, the present invention can be applied to SOC (State Of Charge) determination for a battery.

According to this embodiment, an equivalent circuit model including one or more circuit blocks in each of which a resistance R and a CPE (Constant Phase Element) are connected in parallel is used for fitting. In so doing, fitting error is reduced with respect to a deformed arc-shaped complex impedance characteristic.

Figure 11:
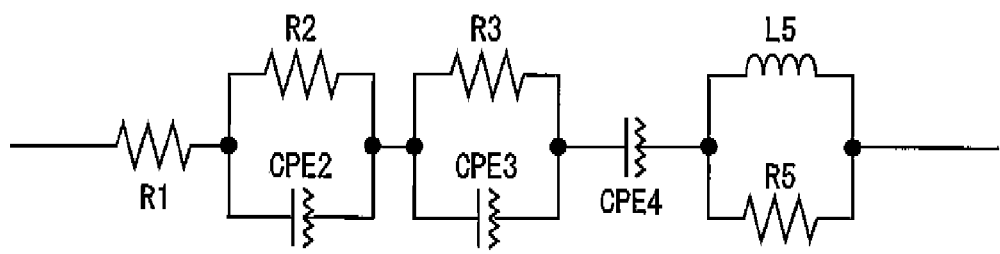
FIG. 11 is a diagram showing an equivalent circuit model in which there are two stages of R and CPE parallel circuit blocks.
Figure 12:
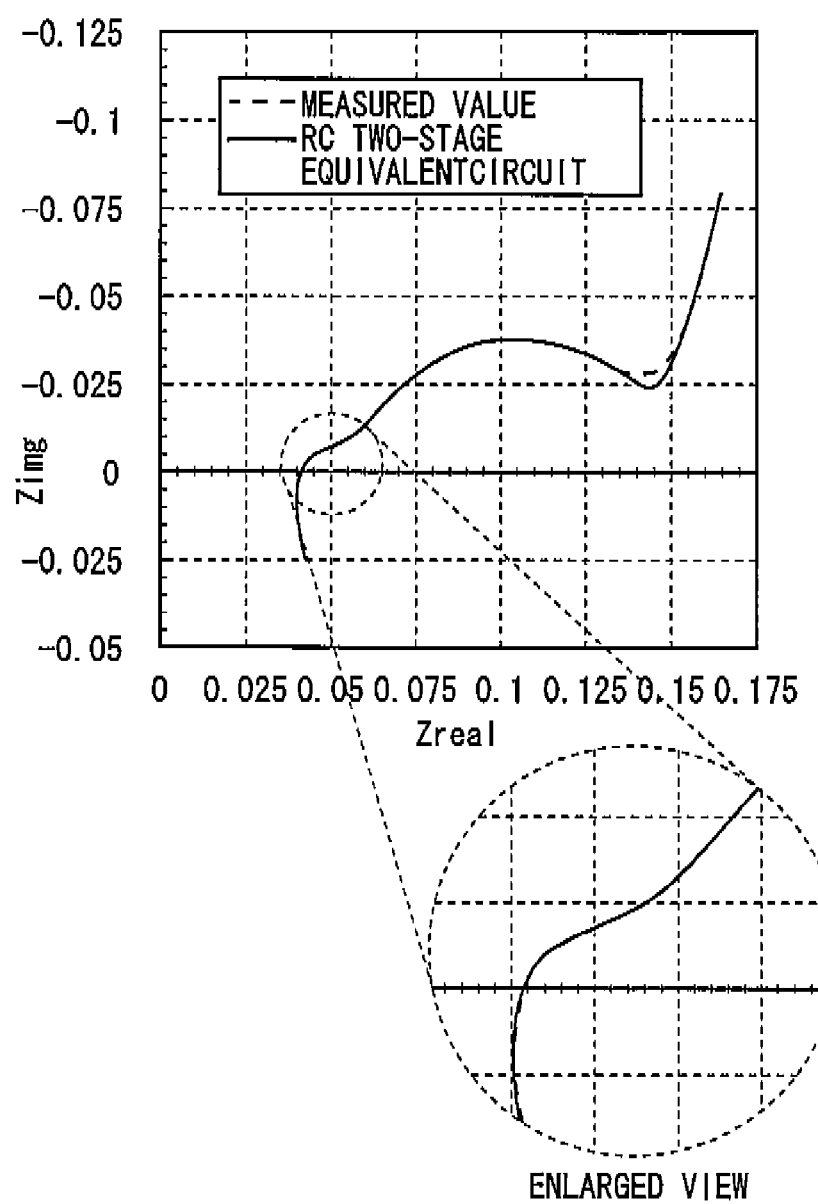
FIG. 12 is a diagram showing measured values and fitting result of the equivalent circuit model in which there are two stages of R and CPE parallel circuit blocks.

Specifically, an equivalent circuit model is used in which a resistance R1, a circuit block in which a resistance R2 and CPE2 are in parallel, a circuit block in which a resistance R3 and CPE3 are in parallel, a CPEO, and a circuit block in which a resistance R5 and a coil L5 are connected to each other as shown in FIG. 11. However, the present invention is not limited to this equivalent circuit model, and any equivalent circuit model is applicable as long as one or more circuit blocks in which a resistance R and a CPE are in parallel are included.

The AC impedance measurement apparatus 300 is an apparatus which measures AC impedance of a battery 400 as a measurement target and records a measurement result thereon, and includes an AC impedance measurement module 310, an AC impedance measurement condition setting module 320, and a measurement data storage module 330. The AC impedance measurement module 310 calculates AC impedance by applying AC voltage or AC current to the battery 400 and measuring the current or the voltage based on a measurement condition received by the AC impedance measurement condition setting module 320 from a user. The measurement is performed over a plurality of frequencies and the result thereof is stored as Nyquist diagram data, for example, on the measurement data storage module 330 as a memory region.

However, a method of measuring AC impedance is not limited to that in the aforementioned example, and various methods can be used. For example, a voltage waveform or a current waveform in which a plurality of frequency signals are superimposed may be applied to measure the current waveform or the voltage waveform, and the voltage waveform and the current waveform may respectively be subjected to Discrete Fourier Transform (DFT) to obtain a ratio for each frequency component. In addition, separately obtained Nyquist diagram data may be stored on the measurement data storage module 330 without measuring the AC impedance.

The circuit constant-degradation degree correlation database 200 is a database which records a correlation between circuit constants as equivalent circuit parameters and a degree of battery degradation (capacity degradation, output degradation, and the like). It is possible to determine a degree of battery degradation by measuring the AC impedance of the battery as a target of the degradation determination, fitting the thus obtained complex impedance characteristic to the equivalent circuit model to obtain the circuit constants, and referring to the circuit constant-degradation degree correlation database 200 based on the obtained circuit constants.

The battery degradation determination device 100 can be configured with the use of an information processing apparatus such as a PC which operates based on computer programs. The battery degradation determination device 100 includes a controller 110, an input and output module 120, a fitting initial value setting module 130, a fitting module 140, a P-value saving module 150, and a degradation determination module 160.

The controller 110 controls battery degradation determination processing by causing each functional module in the battery degradation determination device 100 to operate through a procedure that will be described later. The input and output module 120 controls inputting and outputting of data to and from the circuit constant-degradation degree correlation database 200 and reading of data from the measurement data storage module 330 in the AC impedance measurement device 300. The input and output module 120 also receives operations and setting performed by the user, and outputs a result of battery degradation determination to a display device or the like which is not shown in the drawings.

The fitting initial value setting module 130 sets initial values of circuit constants in the equivalent circuit model based on a predetermined algorithm from the Nyquist diagram data obtained from the measurement data storage module 330.

The fitting module 140 uses the initial values set by the fitting initial value setting module 130 to perform fitting of the circuit constants in the equivalent circuit model. As the fitting algorithm, various known algorithms can be employed.

The P-value saving module 150 is a memory region which saves P values obtained in advance under a predetermined condition prior to the degradation determination processing for a battery as a determination target.

The degradation determination module 160 determines a degree of battery degradation from the circuit constants obtained by fitting the complex impedance characteristic of the battery as a target of the degradation measurement to the equivalent circuit, with reference to the circuit constant-degradation degree correlation database 200. The degree of degradation can be expressed by various manners using an amount of capacity degradation, an amount of output degradation, and the like.

Figure 2:
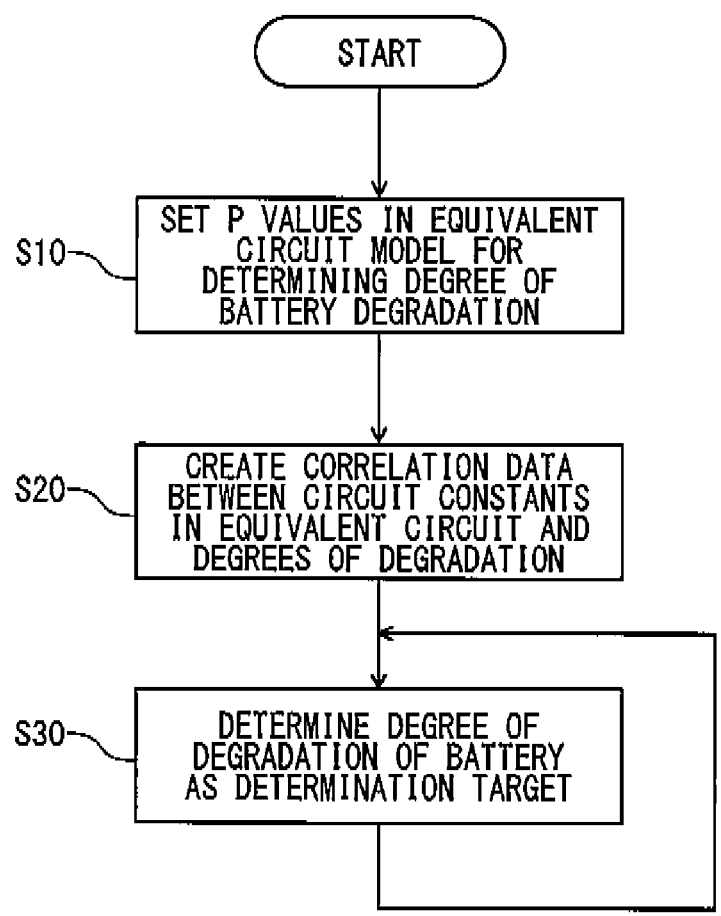
FIG. 2 is a flowchart showing an outline of a battery degradation determination operation of a battery degradation determination device.

Next, description will be given of a battery degradation determination operation of the battery degradation determination device 100 according to this embodiment. FIG. 2 is a flowchart showing an outline of the battery degradation determination operation.

According to this embodiment, the P values in the equivalent circuit model for determining the degree of battery degradation are firstly set (S10). That is, the P values in the equivalent circuit model are set prior to the actual battery degradation determination, and the set P values are used as fixed values to perform fitting of the equivalent circuit model. In so doing, CPE constant T is the only unknown circuit constant in the CPE, and therefore, it is possible to reduce the number of unknown circuit constants even in the equivalent circuit model including R and CPE parallel circuit blocks to the same number as in the CR parallel circuit blocks. Accordingly, it is possible to reduce the fitting error without increasing the number of unknown circuit constants.

Here, the pre-set P values are used to perform fitting of the battery as a target of the degradation determination since it has experimentally been verified that the P values can be regarded as constant values in a same type of battery regardless of a degree of degradation to an extent that the characteristic as a battery is not greatly damaged, an SOC, a temperature, and the like.

Next, circuit constants of a battery whose degree of degradation is known are obtained by the fitting with the use of the set P values as fixed values, and correlation data between the circuit constants in the equivalent circuit model and the degree of degradation is created (S20). The correlation data for different degrees of degradation is created and recorded in the circuit constant-degradation degree correlation database 200.

Thereafter, the degradation determination for the battery as a determination target can be repeatedly performed based on the set P values and the correlation data recorded in the circuit constant-degradation degree correlation database 200 (S30).

Description will be given of a detailed procedure in such processing. First, a description will be given of the detailed procedure in the processing for setting the P values in the equivalent circuit model to be used for determining the degree of degradation of the battery (S10) with reference to a flowchart in FIG. 3.

In this processing, a battery as a reference for setting the P values is prepared and conditioned into a battery state allowing for obtaining complex impedance from which the P values can be specified without causing a plurality of solutions or a divergent solution (S101). The complex impedance characteristic from which the P values can be specified without causing a plurality of solutions or a divergent solution has a shape of a line which becomes wider in a direction of a low frequency area, for example, and is generally a characteristic with a shape of a line which becomes wider under conditions such as a predetermined degradation state, a low temperature, and a low SOC (State of Charge). Since the P values can be regarded to be constant even when such conditions are varied as described above, a battery state allowing for easy fitting can be arbitrarily set. On the contrary, fitting is divergent in some cases for a complex impedance characteristic with arcs in proximity, and therefore, a battery state accompanied by such a complex impedance characteristic is avoided.

Then, the AC impedance measurement device 300 is used to measure the AC impedance of the reference battery (S102).

The obtained measurement data is stored as a Nyquist diagram on the measurement data storage module 330.

Figure 4:
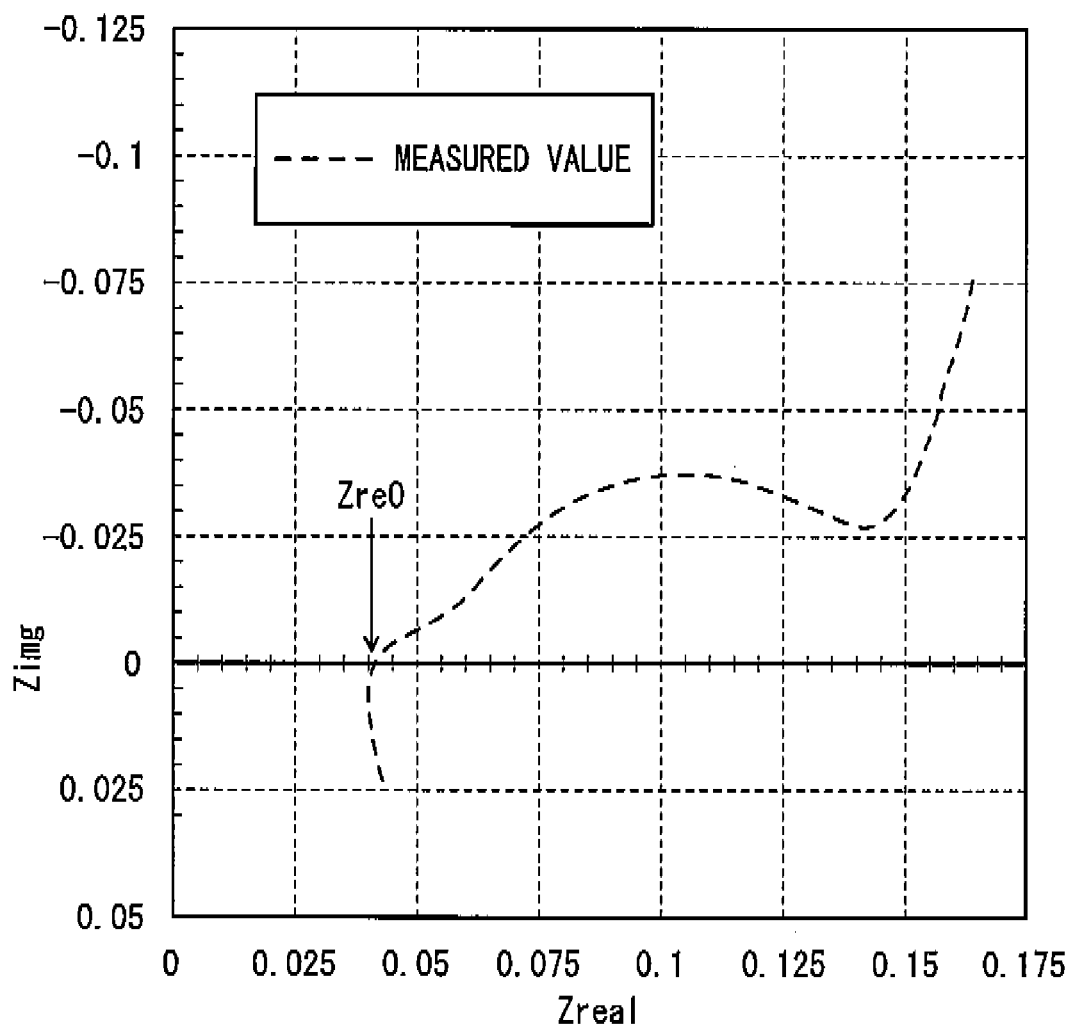
FIG. 4 is a diagram showing Nyquist diagram obtained as a result of measurement of the AC impedance of the reference battery.

Next, an initial value for fitting is set for the obtained Nyquist diagram of the reference battery with the use of the fitting initial value setting module 130 (S103). The initial value can be set based on the following algorithm, for example. In addition, it is assumed that the Nyquist diagram as shown in FIG. 4 has been obtained as a result of measurement of the AC impedance of the reference battery.

In relation to an R1 initial value, Zre0 which is Zre at a zero crossing point of the Nyquist diagram is obtained, and Zre0 is regarded as an R1 initial value.

Figure 5:
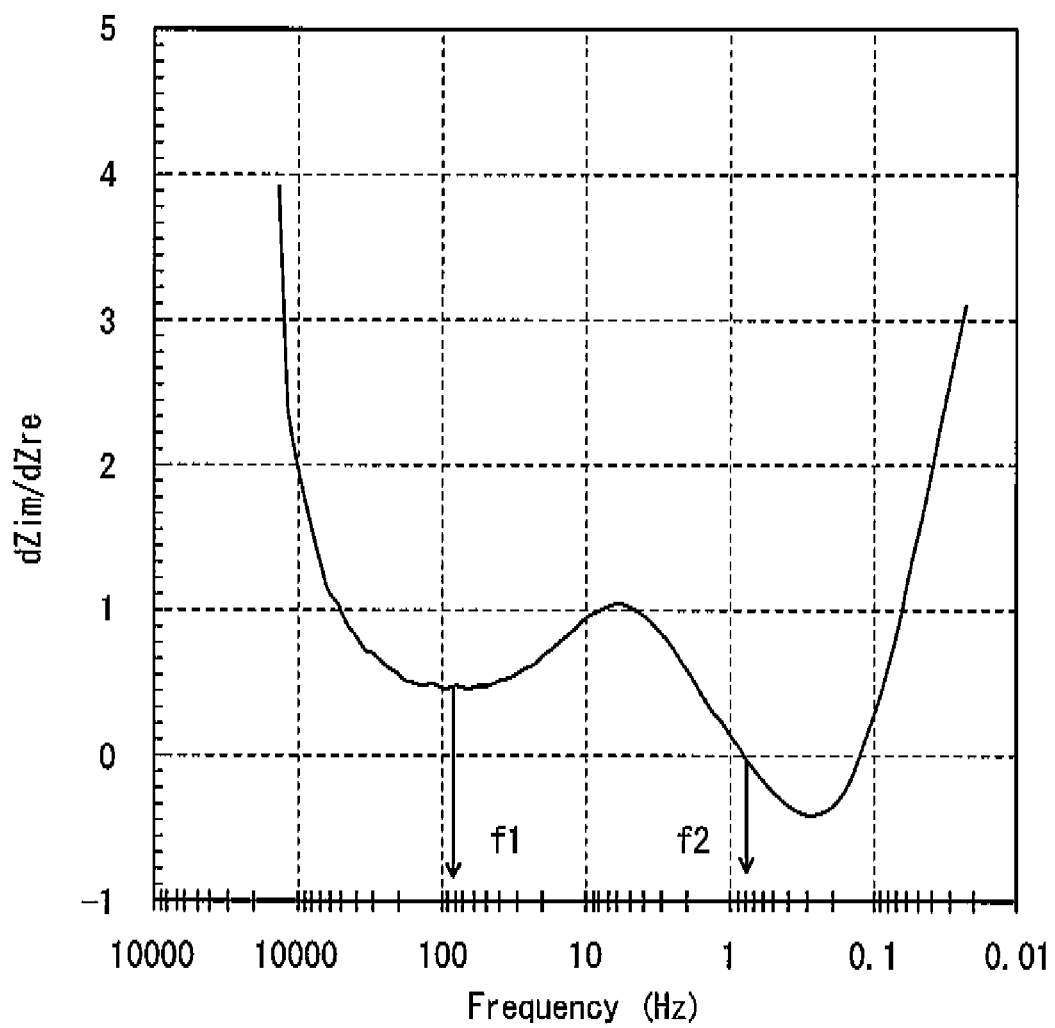
FIG. 5 is a diagram showing setting of a P2 initial value and a P3 initial value.

In relation to a P2 initial value and a P3 initial value, a frequency characteristic of dZim(f)/DZre(f) as shown in FIG. 5 is obtained, a point at which dZim(f)/DZre(f) becomes zero or an inflection point is searched in an order from a higher frequency, and a first frequency and a second frequency are regarded as f1 and f2, respectively. However, if an inflection point appears first, the frequency at the inflection point is used, and zero is ignored once.

Then, the P2 initial value is obtained from a ratio between dZim(f1) and DZre(f1)−Zre0 as shown by [Equation 2].

$$(Zre(f1)-Zre0)/Zim(f1)=2[1+\cos(P2*\pi/2)]/\sin(P2*\pi/2) \quad [\text{Equation 2}]$$

Next, Zim at points where Zre becomes Zre(f2)−Zim(f2)×¾, Zre(f2)−Zim(f2)/4, Zre(f2)+Zim(f2)/4, and Zre(f2)+Zim(f2)×¾ is obtained. When there is no data point, linear interpolation may be performed.

Based on the obtained four data points, an ellipse with a longer axis in parallel with a Zre direction is approximated by a known method. Then, the P3 initial value is obtained from [Equation 3] in which b represents a length of the longer axis of the obtained ellipse and a represents the shorter axis thereof.

$$b/a=2[1+\cos(P2*\pi/2)]/\sin(P3*\pi/2) \quad [\text{Equation 3}]$$

In addition, an R2 initial value is obtained as R2=(Zre(f1)−Zre0)×2, a T2 initial value is obtained as T2=1/[(2πf1)^P2×R2], an R3 initial value is obtained as R3=b, and a T3 initial value is obtained as T3=1/[(2πf2)^P3×R3]. It is a matter of course that another algorithm may be used to set an initial value of each circuit constant.

Figure 3:
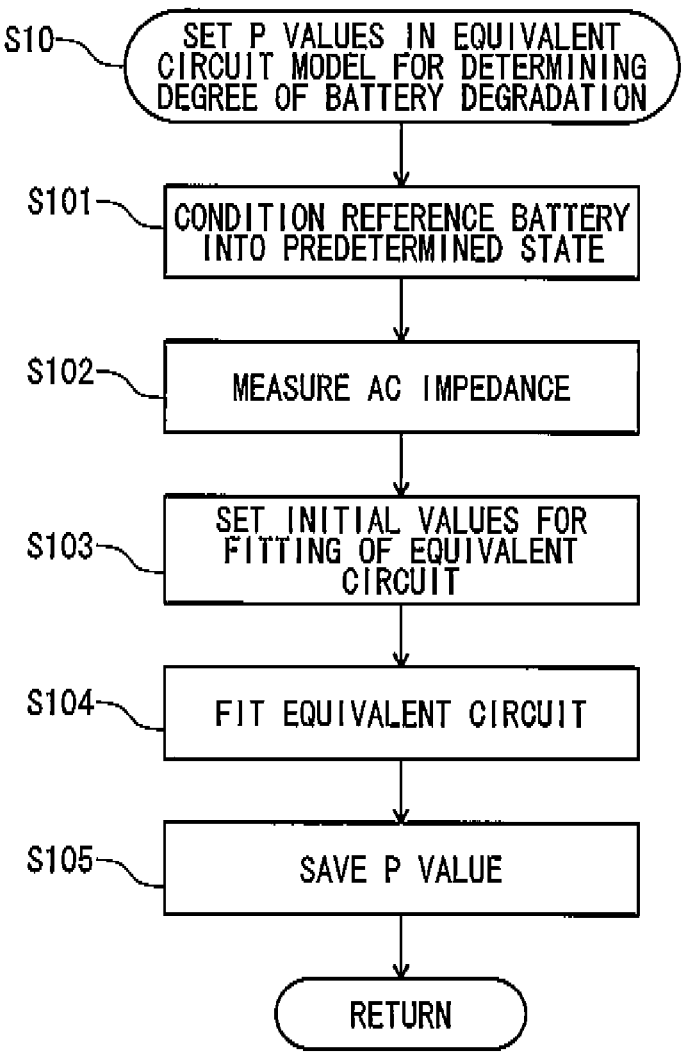
FIG. 3 is a flowchart showing the detailed procedure in the processing for setting the P values in an equivalent circuit model to be used for determining the degree of degradation of the battery.

Returning to the description of FIG. 3, when the initial values are set, the fitting module 140 performs fitting of the equivalent circuit model with the use of the set initial values (S104). Since the reference battery has been conditioned so as to obtain a Nyquist diagram with a shape which becomes wider in the direction of a low frequency area, it is possible to easily obtain each circuit constant by performing fitting with the use of a known algorithm.

Then, the P values (P2, P3) are stored on the P-value saving module 150 among the circuit constants obtained by the fitting (S105), and processing for setting the P values in the equivalent circuit model for determining the degree of battery degradation (S10) is completed.

Figure 6:
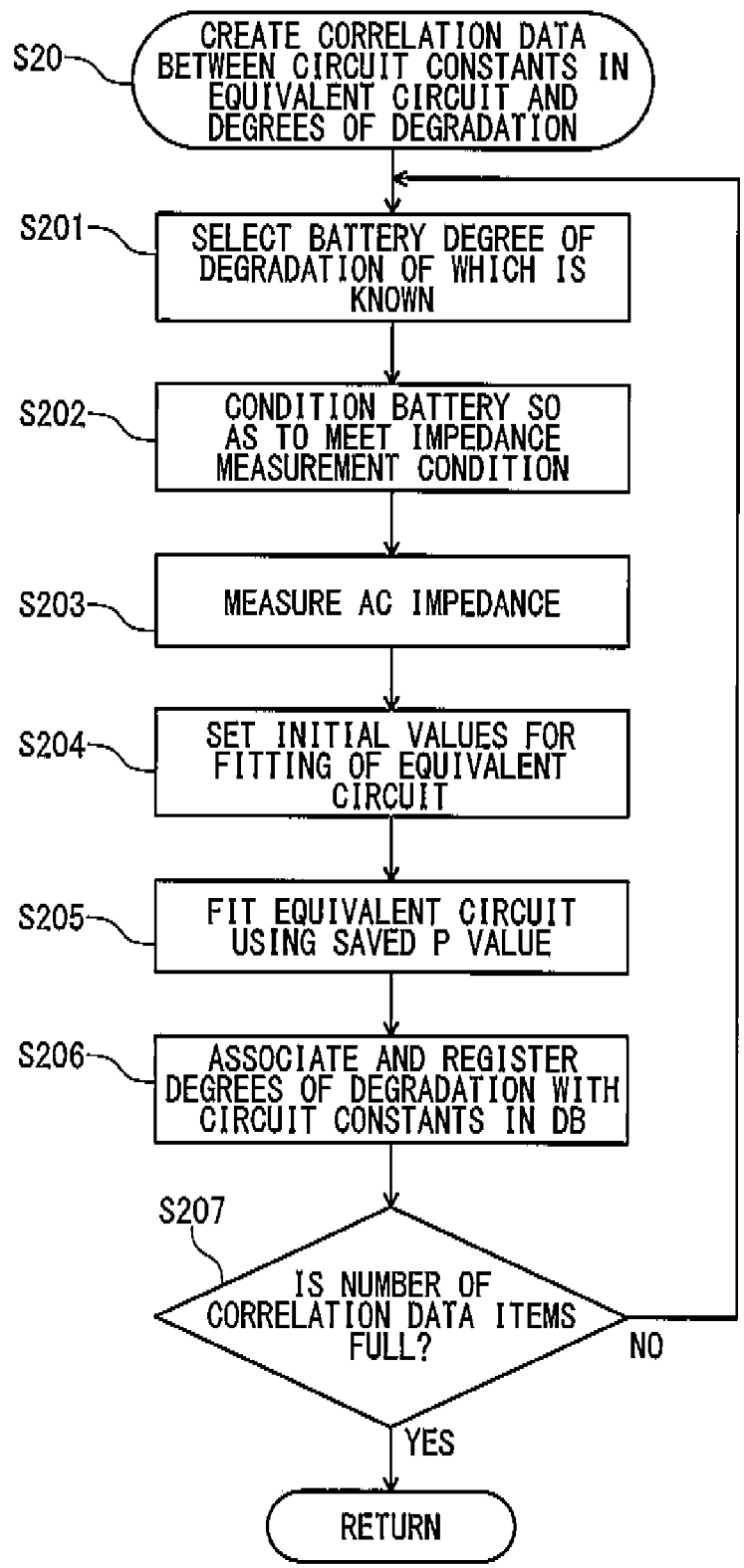
FIG. 6 is a flowchart showing the detailed procedure in the processing for creating correlation data between circuit constants in the equivalent circuit model and the degree of degradation.

Next, description will be given of detailed procedure in the processing for creating correlation data between the circuit constants in the equivalent circuit model and the degree of degradation (S20) with reference to a flowchart in FIG. 6.

First, a battery whose degree of degradation such as capacity degradation and output degradation has been known is selected (S201). Then, the selected battery is conditioned so as to meet the impedance measurement condition for determining the degree of degradation (S202), and the AC impedance is measured with the use of the AC impedance measurement device 300 (S203). A predetermined temperature, a predetermined SOC, or the like can be set as the impedance measurement condition for determining the degree of degradation. The obtained measurement data is stored as a Nyquist diagram on the measurement data storing module 330.

Next, initial values for fitting are set for the obtained Nyquist diagram of the battery with a known degree of degradation with the use of the fitting initial value setting module 130 (S204). The initial values can be set based on the same algorithm as that used in the aforementioned processing (S103). However, it is not necessary to calculate P initial values since the P values are fixed values.

Then, the fitting module 140 uses the P values saved in the P-value saving module 150 as fixed circuit constants and performs fitting of the equivalent circuit model with the use of the set initial values (S205). Since the P values are fixed circuit constants, the number of unknown circuit constants is the same as that in the RC two-stage model. Accordingly, it is possible to easily obtain each circuit constant by performing fitting with the use of the known algorithm.

The obtained circuit constants are associated with the known degree of battery degradation and registered as correlation data in the circuit constant-degradation degree correlation database 200 (S206).

Figure 7:
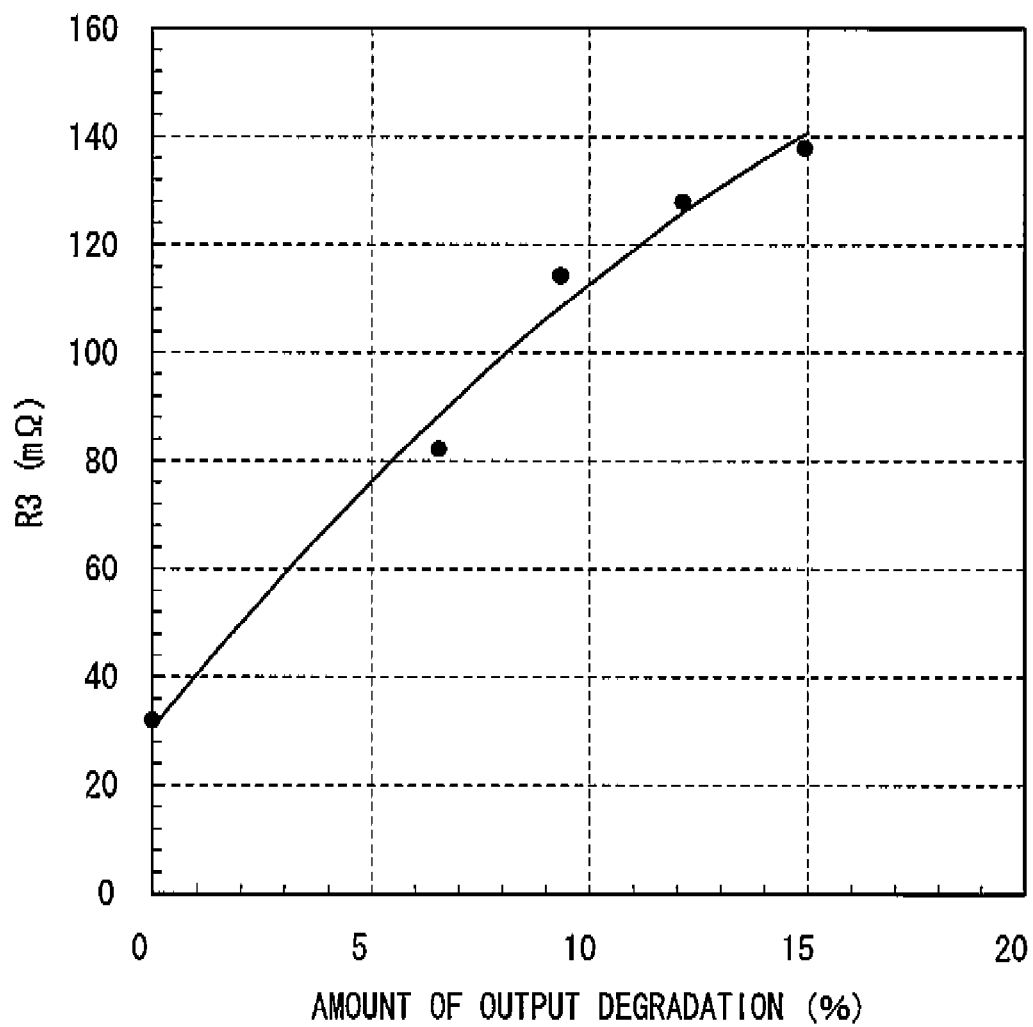
FIG. 7 is a diagram showing a correlation example between the circuit constant and the amount of output degradation.

The above processing is repeatedly performed on batteries with different degrees of degradation (S207: No), and when the number of registered correlation data items is full (S207: Yes), the processing for creating the correlation data between the circuit constants in the equivalent circuit model and the degrees of degradation (S20) is completed. FIG. 7 is a diagram showing a correlation example between the circuit constant R3 and the amount of output degradation. As shown in the drawing, it has been known that R in the equivalent circuit model becomes greater as a charge-discharge cycle is repeated.

Figure 8:
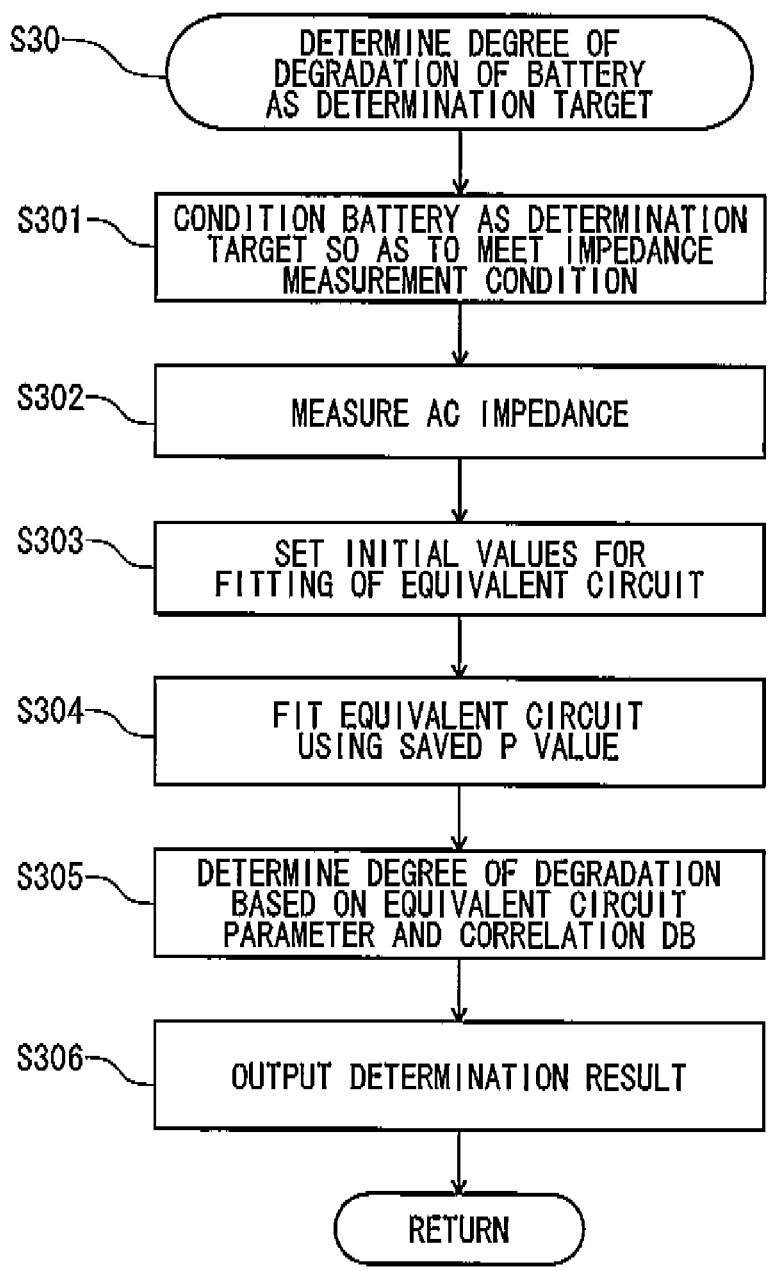
FIG. 8 is a flowchart showing the detailed procedure in processing for determining the degree of degradation of a battery as a determination target.
Figure 9:
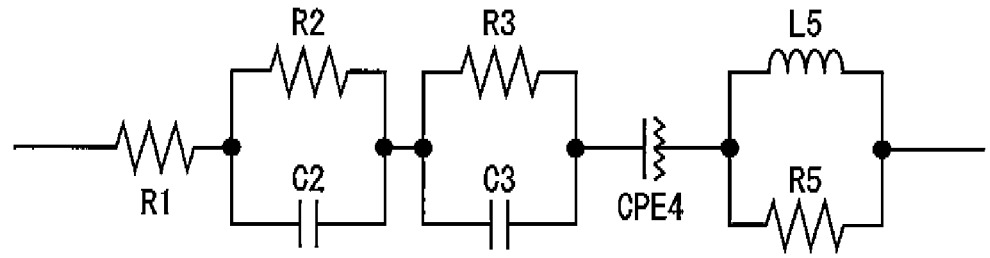
FIG. 9 is a diagram showing an example of a RC two-stage model.
Figure 10:
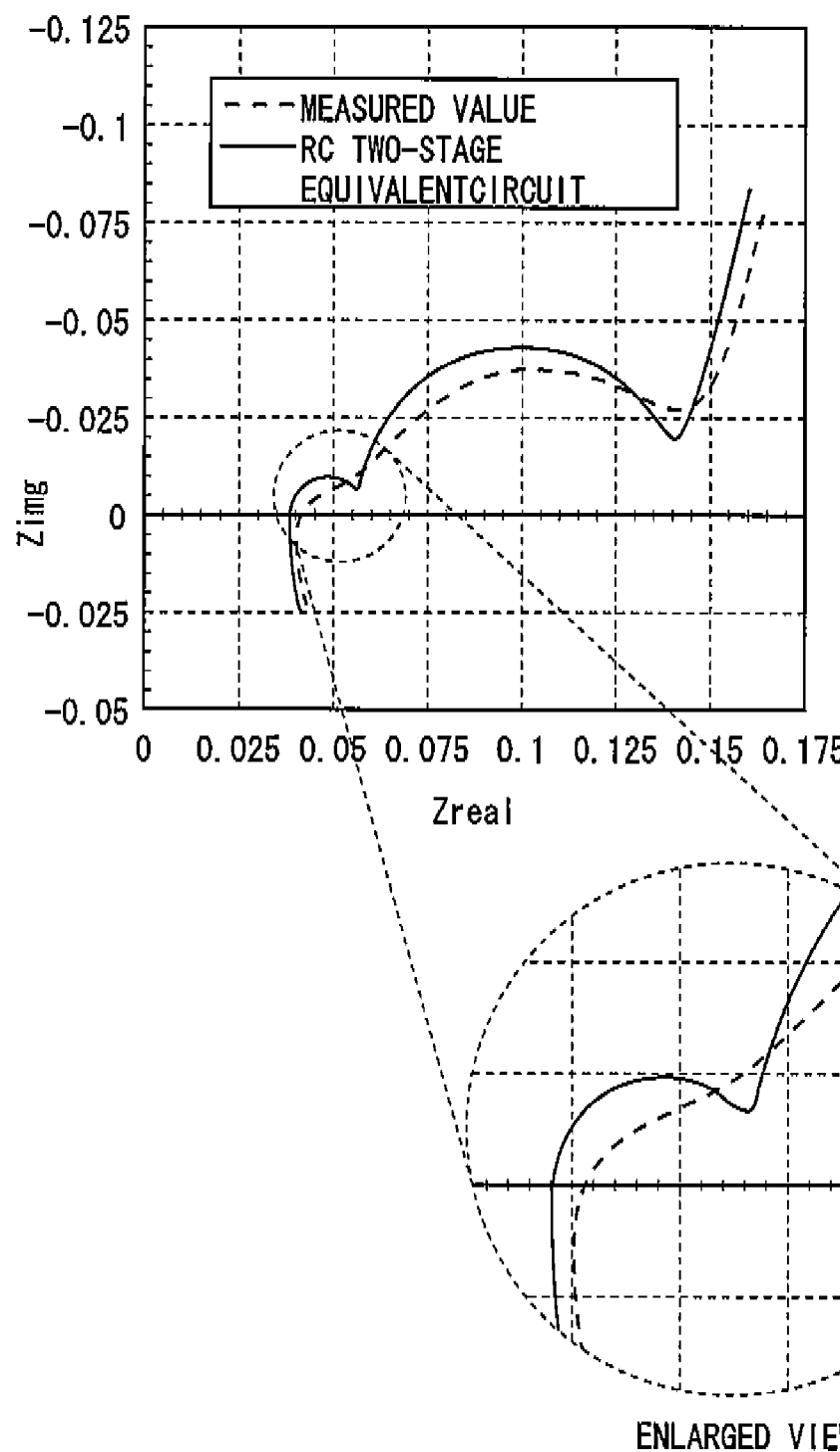
FIG. 10 is a diagram showing measured values and fitting result of the RC two-stage model.

Next, description will be given of detailed procedure in processing for determining the degree of degradation of a battery as a determination target (S30) with reference to a flowchart in FIG. 8.

First, a battery as a target of degradation determination is conditioned so as to meet the impedance measurement condition for determining the degree of degradation (S301). Specifically, a temperature, an SOC, and the like are conditioned to the same levels as those in the processing for creating the correlation data between the circuit constants in the equivalent circuit model and the degrees of degradation (S20).

Then, the AC impedance of the battery as a determination target is measured with the use of the AC impedance measurement device 300 (S302). The obtained measurement data is stored as a Nyquist diagram on the measurement data storage module 330.

Next, initial values for fitting are set for the obtained Nyquist diagram of the battery as a determination target with the use of the fitting initial value setting module 130 (S303). The initial values can be set based on the same algorithm as that used in the aforementioned processing (S103). However, it is not necessary to calculate P initial values since the P values are fixed values.

Then, the fitting module 140 uses the P values saved in the P-value saving module 150 as fixed circuit constants and performs fitting of the equivalent circuit model with the use of the set initial values (S304). Since the P values are fixed circuit constants, the number of unknown circuit constants is the same as that in the RC two-stage model. Accordingly, it is possible to easily obtain each circuit constant by performing fitting with the use of the known algorithm.

Then, the degradation determination module 160 determines a degree of degradation of the battery as a determination target based on the obtained circuit constants with reference to the circuit constant-degradation degree correlation database 200 (S305). A determination result is output to a display device, a printing device, or the like which is not shown in the drawings (S306), and the processing for determining the degree of degradation of the battery as a determination target (S30) is completed.

While fitting error can be reduced in this embodiment, the characteristic including the P values fluctuates and the fitting error becomes greater when the battery is in an unserviceable state after degradation.

For this reason, the degradation determination module 160 may obtain a square error between the complex impedance characteristic calculated with the use of the circuit constants obtained as a result of fitting and the complex impedance characteristic obtained as a result of measurement, and may output, via the input and output module 120, a determination result indicating that the use of the battery is not appropriate when the square error becomes equal to or greater than a pre-set reference value.

Hereinafter, the battery impedance measuring device according to the present embodiment will be described in relation to hardware components.

Figure 13:
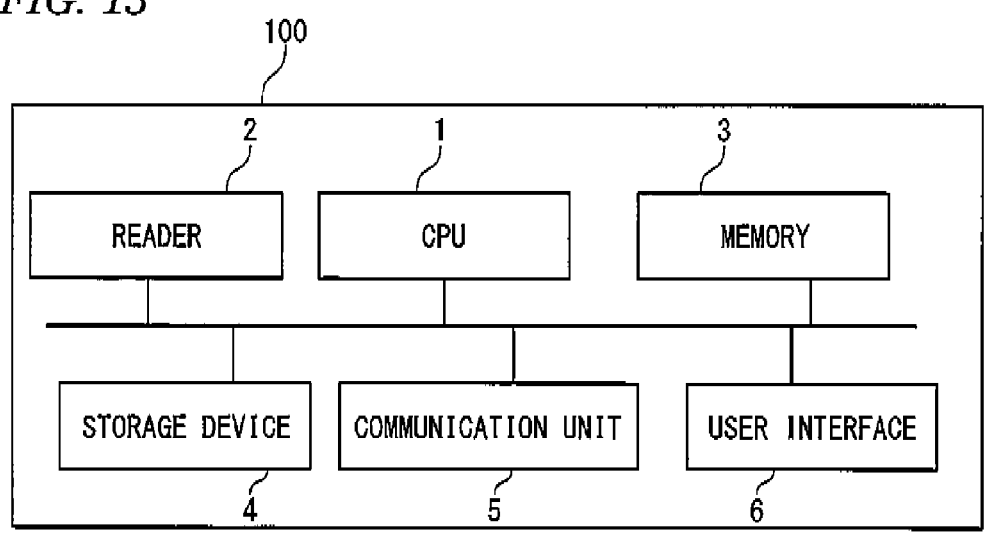
FIG. 13 is a schematic diagram showing a hardware configuration of the battery degradation determination device according to the embodiment.

FIG. 13 is a schematic diagram showing a hardware configuration of the battery degradation determination device 100 according to the present embodiment. As shown in FIG. 13, the battery degradation determination device 100 includes a CPU 1, a reader 2, a memory 3, a storage device 4, a communication unit 5 and a user interface 6. The CPU 1 (for example, a processor) may serve as the controller 110, the input and output module 120, the fitting initial value setting module 130, the fitting module 140, the P-value saving module 150, and the degradation determination module 160 shown in FIG. 1.

The memory 3 may be any type of memory such as ROM, RAM or a flash memory. The memory 3 may serve as a working memory of the CPU 1 when the CPU 1 executes a program. The storage device 4 is configured to store programs to be executed by the CPU 1 and/or data (for example, P values) generated by the respective components. The storage device 4 may be any type of storage device such as a hard disk drive (HDD) or solid state drive (SSD). A program which includes instructions for causing the CPU 1 to execute respective operations performed by the battery degradation determination device 100 may be stored in the storage device 4 or in a computer-readable medium such as a Blu-ray Disc (trademark), DVD, a CD, a floppy disc, a flash memory, or magneto-optical (MO) disc. The reader 2 is configured to read the program stored in the above-computer readable medium into the memory 3. The program may be also downloaded from another device (for example, a server) on a network (for example, the Internet) through the communication unit 5. With this configuration shown in FIG. 13, the CPU 1 is configured to implement the respective operations performed by the battery degradation determination device 100 according to the program read from the reader 2 or downloaded through the communication unit 5.

In the determination of a degree of degradation according to this embodiment, the fitting is performed with the use of an equivalent circuit model including circuit blocks, in each of which a register R and CPE are in parallel as described above, it is possible to reduce fitting error. Accordingly, appropriateness of a determination result can be enhanced. Furthermore, P values are fixed values among circuit constants in the CPE, and therefore, the number of unknown circuit constants to be fitted is the same as that in the RC model, which facilitates the fitting.

What is claimed is:

1. A battery degradation determination device comprising:
   a fitting module configured to fit AC impedance measurement data into an equivalent circuit model including at least one circuit block in which a resistance and a constant phase element are connected in parallel, and to obtain circuit constants in the equivalent circuit model;
   a P-value saving module configured to save P values being index of the constant phase element obtained by fitting AC impedance measurement data of a reference battery to the equivalent circuit model; and
   a degradation determination module configured to perform degradation determination for a battery as a determination target based on circuit constants obtained by fitting AC impedance measurement data of the battery as a determination target to the equivalent circuit model with the use of the P values as fixed values, with reference to correlations between degrees of battery degradation and the circuit constants in the equivalent circuit model.

2. The battery degradation determination device according to claim 1,
   wherein the degradation determination module is configured to determine that use of the battery as a determination target is not appropriate when fitting error by the obtained circuit constants is equal to or greater than a reference value.

3. The battery degradation determination device according to claim 1, further comprising:
   a fitting initial value setting module configured to set initial values of the circuit constants prior to the fitting by the fitting module,
   wherein the fitting initial value setting module is configured to set the initial values with the use of a zero crossing point at which Zim=0 and elliptical approximation using an inflection point and zero of a frequency characteristic diagram of dZim/dZre when AC impedance measurement data is expressed as a Nyquist diagram.

4. A battery degradation determination method comprising:
   saving P values being index of a constant phase element obtained by fitting AC impedance measurement data of a reference battery to an equivalent circuit model including at least one circuit block in which a resistance and the constant phase element are connected in parallel; and
   performing degradation determination for a battery as a determination target based on circuit constants obtained by fitting AC impedance measurement data of the battery as a determination target to the equivalent circuit model with the use of the P values as fixed values, with reference to database storing correlations between degrees of battery degradation and the circuit constants in the equivalent circuit model.

5. The battery degradation determination method according to claim 4, further comprising:
   creating the database by recording correlations between a plurality of known degrees of degradation and circuit constants obtained by fitting AC impedance measurement data of a battery whose degree of degradation is known to the equivalent circuit model with the use of the P values as fixed values.

6. A battery degradation determination system comprising:
   an AC impedance measurement device configured to measure AC impedance of a battery;
   a battery degradation determination device comprising a fitting module configured to fit AC impedance measurement data obtained from the AC impedance measurement device into an equivalent circuit model including at least one circuit block in which a resistance and a constant phase element are connected in parallel, and to obtain circuit constants in the equivalent circuit model; and a database configured to store correlations between degrees of battery degradation and the circuit constants in the equivalent circuit model, wherein the battery degradation determination device comprises a P-value saving module configured to save P values being index of the constant phase element obtained by fitting AC impedance measurement data of a reference battery obtained from the AC impedance measurement device to the equivalent circuit model, and a degradation determination module configured to perform degradation determination for a battery as a determination target based on circuit constants obtained by fitting AC impedance measurement data of the battery as a determination target obtained from the AC impedance measurement device to the equivalent circuit model with the use of the P values as fixed values, with reference to the database.

\* \* \* \* \*